United States Patent
Kwon (10) Patent No.: US 9,263,099 B2
(45) Date of Patent: Feb. 16, 2016

(54) SEMICONDUCTOR MEMORY DEVICE FOR REDUCING STANDBY CURRENT

(71) Applicant: SK hynix Inc., Icheon-si Gyeonggi-do (KR)

(72) Inventor: Tae Heui Kwon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 168 days.

(21) Appl. No.: 14/023,583

(22) Filed: Sep. 11, 2013

(65) Prior Publication Data

US 2014/0269138 A1 Sep. 18, 2014

(30) Foreign Application Priority Data

Mar. 14, 2013 (KR) .................. 10-2013-0027422

(51) Int. Cl.
*G11C 5/14* (2006.01)
(52) U.S. Cl.
CPC *G11C 5/148* (2013.01); *G11C 5/14* (2013.01); *G11C 5/147* (2013.01)
(58) Field of Classification Search
CPC ........... G11C 5/147; G11C 5/148; G11C 5/14
USPC .......... 365/227, 229, 189.05, 189.06, 189.09; 327/541, 540; 323/316, 267, 269
See application file for complete search history.

(56) References Cited

U.S. PATENT DOCUMENTS

| | | | |
|---|---|---|---|
| 2001/0033154 A1* | 10/2001 | Oh | 323/281 |
| 2006/0091938 A1* | 5/2006 | Kim | 327/540 |
| 2007/0041257 A1* | 2/2007 | Kim | 365/207 |
| 2008/0061856 A1* | 3/2008 | Byeon | 327/333 |
| 2008/0279031 A1* | 11/2008 | Kwon et al. | 365/227 |
| 2009/0207674 A1* | 8/2009 | Chang et al. | 365/189.09 |
| 2010/0327839 A1* | 12/2010 | Kim | 323/311 |

FOREIGN PATENT DOCUMENTS

| | | |
|---|---|---|
| KR | 1020010017280 A | 3/2001 |
| KR | 1020050079538 A | 8/2005 |
| KR | 1020080026024 A | 3/2008 |
| KR | 1020100052305 A | 5/2010 |

* cited by examiner

*Primary Examiner* — Toan Le
(74) *Attorney, Agent, or Firm* — William Park & Associates Ltd.

(57) ABSTRACT

A semiconductor memory device includes a standby voltage providing unit. The standby voltage providing unit is configured to receive an external voltage, primarily clamp and secondarily clamp a predetermined voltage, and provide the predetermined voltage as an internal voltage, during a standby mode.

20 Claims, 6 Drawing Sheets

SEMICONDUCTOR MEMORY DEVICE FOR REDUCING STANDBY CURRENT

CROSS-REFERENCES TO RELATED APPLICATION

The present application claims priority under 35 U.S.C. §119(a) to Korean application number 10-2013-0027422, filed on Mar. 14, 2013, in the Korean Intellectual Property Office, which is incorporated herein by reference in its entirety.

BACKGROUND

1. Technical Field

Various embodiments relate to a semiconductor memory device, and more particularly, to a semiconductor memory device for reducing a standby current.

2. Related Art

In general, various attempts have been made to reduce power consumption of a semiconductor memory device, or particularly, a power required during a standby mode as well as an operating voltage during an active mode of a semiconductor memory device in the case of a mobile product. Therefore, technologies for stably reducing an operating voltage of a memory module inside a chip have been proposed. Examples of the technologies may include a technology which converts an external voltage into an internal voltage and uses the internal voltage.

Figure 1:
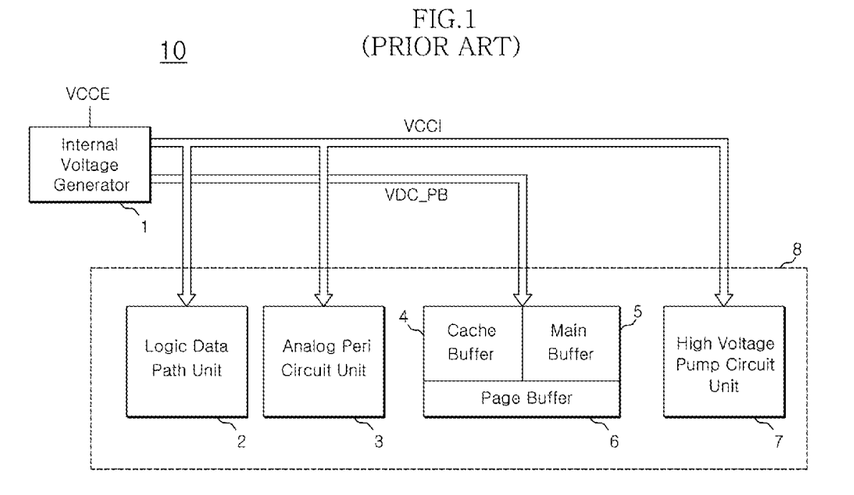
FIG. 1 is a conceptual block diagram of a conventional semiconductor memory device.

FIG. 1 is a conceptual block diagram of a conventional semiconductor memory device which generates and uses an internal voltage.

Referring to FIG. 1, an internal voltage generator 1 receiving an external voltage VCCE generates first and second internal voltages VCCI and VDC_PB having a voltage level reduced by a predetermined amount from the external voltage VCCE.

Between the first and second internal voltages VCCI and VDC_PB, the first internal voltage VCCI may be used in a logic data path unit 2, an analog peri circuit unit 3, and a high voltage pump circuit unit 7 of an internal circuit 8, and the second internal voltage VDC_PB may be used as power for a page buffer 6 coupled to a cache buffer 4 and a main buffer 5.

The reason to use the first and second internal voltages VCCI and the VDC_PB without directly using the external voltage VCCE is to reduce the entire operating current and provide a constant internal voltage to secure the stability of operation even though the external voltage VCCE is changed. Furthermore, the first and second internal voltages VCCI and VDC_PB may have substantially the same level. However, the internal voltages are separately used for a specific circuit unit (for example, page buffer) to prevent a peak current from occurring during operation or prevent the influence of the peak current.

Figure 2:
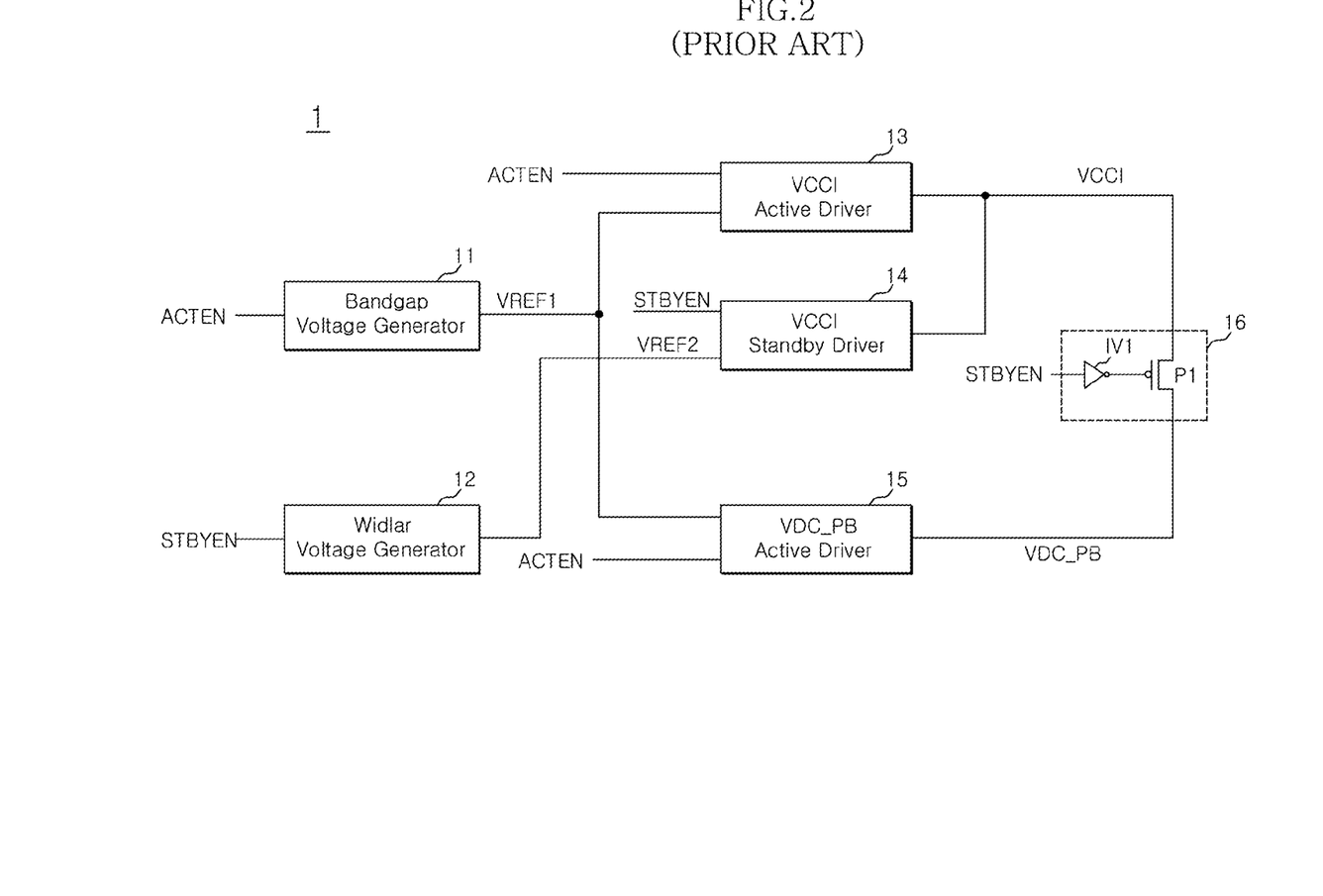
FIG. 2 is a simple block diagram of an internal voltage generator of FIG. 1.

FIG. 2 is a simple block diagram of the internal voltage generator 1.

Referring to FIG. 2, the internal voltage generator 1 includes a bandgap voltage generator 11, a Widlar voltage generator 12, a VCCI active driver 13, a VCCI standby driver 14, a VDC_PB active driver 15, and a standby control unit 16.

The bandgap voltage generator 1 is a reference voltage generator to generate a constant voltage for PVT (Process/Voltage/Temperature) variations. For example, the bandgap voltage generator 1 generates a first reference voltage VREF1 in response to an active enable signal ACTEN. The first reference voltage VREF1 generated by the bandgap voltage generator 1 is provided to the VCCI active driver 13 and the VDC_PB active driver 15.

The VCCI active driver 13 and the VDC_PB active driver 15, receiving the first reference voltage VREF1, may provide a regulated voltage through an operational amplifier provided therein. Thus, the VCCI active driver 13 provides the first internal voltage VCCI, and the VDC_PB active driver 15 provides the second internal voltage VDC_PB.

During an active mode, the active enable signal ACTEN is activated to operate the bandgap voltage generator 1, the VCCI active driver 13, and the VDC_PB active driver 15. During the other modes, the active enable signal ACTEN is deactivated to disable the bandgap voltage generator 1, the VCCI active driver 13, and the VDC_PB active driver 15.

The Widlar voltage generator 12 operates in response to a standby enable signal STBYEN, and generates a second reference voltage VREF2.

The second reference voltage VREF2 is provided to the VCCI standby driver 14.

The VCCI standby driver 14 is a small-sized driver that consumes a relatively small amount of current when operating. Since only a minimum voltage required for retaining data may be provided during the standby mode, the VCCI standby driver 14 has a small driving ability.

The reason to use the Widlar voltage generator 12 is that the Widlar voltage generator 12 is a reference voltage generator which is driven by a smaller amount of current than the bandgap voltage generator 11.

During the standby mode, the VCCI standby driver 14 and the standby control unit 16 are enabled.

The standby control unit 16 includes an inverter IV1 and a PMOS transistor P1.

The PMOS transistor P1 is turned on in response to the standby enable signal STBYEN.

Thus, during the standby mode, the voltage provided through the VCCI standby driver 14 may be commonly applied as the first and second internal voltages VCCI and VDC_PB.

During the standby mode, the Widlar voltage generator 12 is used to reduce a larger amount of current than during the active mode, and one common VCCI standby driver 14 is used to apply the same voltage level as the first and second internal voltages VCCI and VDC_PB, without using individual standby drivers. However, as the technology is gradually advanced and mobile applications require a very small standby current, there is a demand for reducing a current.

SUMMARY

In an embodiment of the present invention, a semiconductor memory device includes a standby voltage providing unit configured to receive an external voltage, primarily clamp and secondarily clamp a predetermined voltage, and provide the predetermined voltage as an internal voltage, during a standby mode.

In an embodiment of the present invention, a semiconductor memory device includes: an active driver configured to receive a reference voltage and provide a first internal voltage at a first level during an active mode; and a standby voltage providing unit configured to provide the first internal voltage at a second level lower than the first level, during a standby mode. The standby voltage providing unit includes cascade-coupled transistors having different types of channels.

In an embodiment of the present invention, a semiconductor memory device includes a standby voltage providing unit configured to double-clamp a predetermined voltage to provide an internal voltage having a reduced level in a standby mode in comparison to an active mode. The standby voltage providing unit includes a depletion-type NMOS transistor and an enhancement-type NMOS transistor to clamp the predetermined voltage using threshold voltages.

In an embodiment, a semiconductor memory device includes a standby voltage providing unit to receive an external voltage, and clamp a predetermined voltage with a first clamping section and a second clamping section to provide an internal voltage which is reduced by a predetermined level during a standby mode in comparison to an active mode.

In an embodiment, a memory system includes a memory controller and a semiconductor memory device. The semiconductor memory device includes a standby voltage providing unit configured to receive an external voltage, primarily clamp and secondarily clamp a predetermined voltage, and provide the predetermined voltage as an internal voltage, during a standby mode.

In an embodiment, an electronic device includes a memory system communicatively coupled to a central processing unit. The memory system includes a semiconductor memory device. The semiconductor memory device includes a standby voltage providing unit configured to receive an external voltage, primarily clamp and secondarily clamp a predetermined voltage, and provide the predetermined voltage as an internal voltage, during a standby mode.

BRIEF DESCRIPTION OF THE DRAWINGS

Features, aspects, and embodiments are described in conjunction with the attached drawings, in which.

DETAILED DESCRIPTION

Hereinafter, a semiconductor memory device for reducing a standby current according to the present invention will be described below with reference to the accompanying drawings through embodiments.

Figure 3:
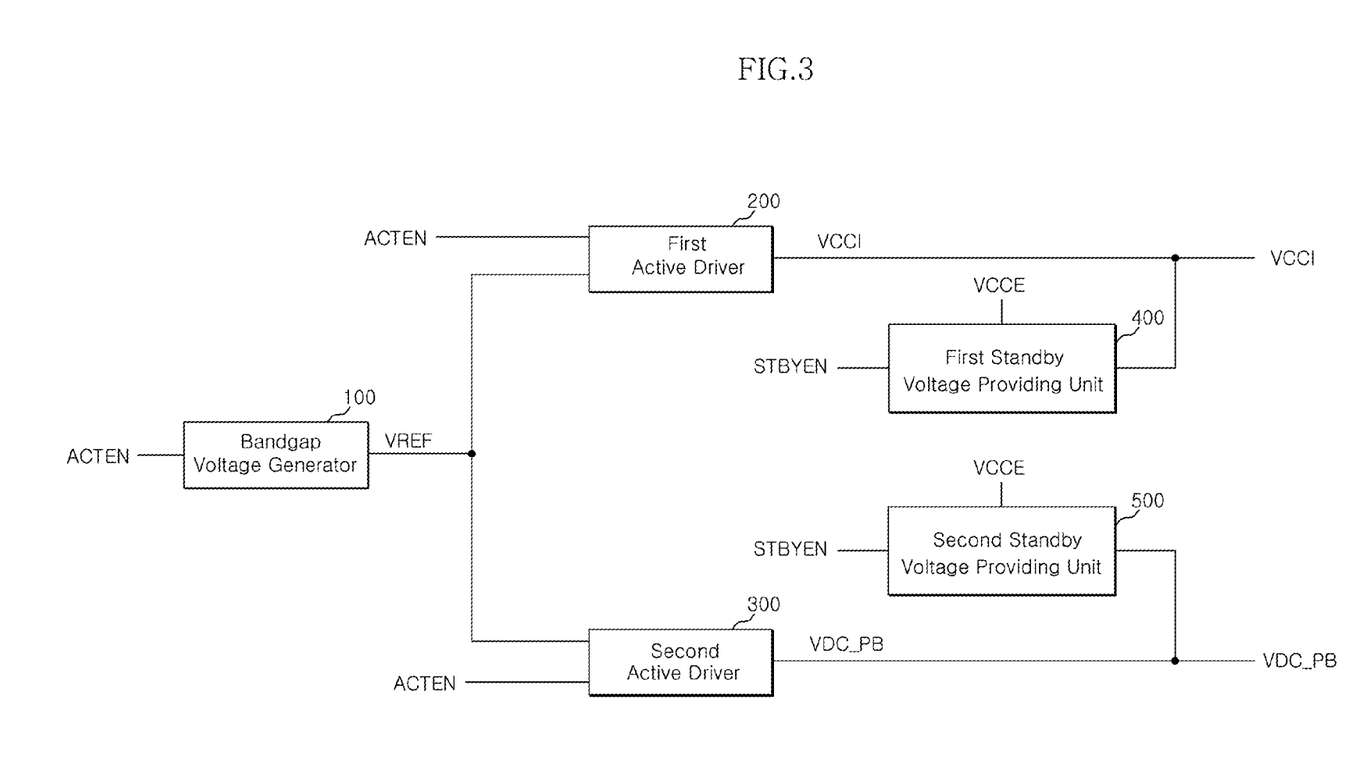
FIG. 3 is a block diagram of a semiconductor memory device according to an embodiment of the present invention.

Referring to FIG. 3, the semiconductor memory device may include a bandgap voltage generator 100, a first active driver 200, a second active driver 300, a first standby voltage providing unit 400, and a second standby voltage providing unit 500.

The bandgap voltage generator 100 may be configured to generate a reference voltage VREF in response to an active enable signal ACTEN. The bandgap voltage generator 100 may be a reference voltage generator to generate a constant voltage for PVT variations. Since the bandgap voltage generator 100 responds to the active enable signal ACTEN, the bandgap voltage generator 100 may continuously maintain an enabled state during normal operations, that is, during read, program, and erase operations. During a standby state, however, since the active enable signal ACTEN is deactivated, the bandgap voltage generator 100 may be disabled.

The first active driver 200 may be configured to receive the active enable signal ACTEN and a reference voltage VREF and provide a first internal voltage VCCI. That is, the first active driver 200 may be enabled during an active mode, amplify and regulate the reference voltage VREF, and provide the regulated voltage as the first internal voltage VCCI.

The first internal voltage VCCI may have a level of about 2.3V, but is not limited thereto.

The second active driver 300 may be configured to receive the active enable signal ACTEN and the reference voltage VREF and provide a second internal voltage VDC_PB. That is, the second active driver 300 may be enabled during the active mode, amplify and regulate the reference voltage VREF, and provide the regulated voltage as the second internal voltage VDC_PB.

The second internal voltage VDC_PB may have a level of about 2.3V, but is not limited thereto.

The first standby voltage providing unit 400 may be configured to provide an internal voltage level required during the standby mode as the first internal voltage VCCI in response to a standby enable signal STBYEN.

Similarly, the second standby voltage providing unit 500 may be configured to provide an internal voltage level required during the standby mode as the second internal voltage VDC_PB in response to the standby enable signal STBYEN.

The first and second standby voltage providing units 400 and 500 according to an embodiment of the present invention may be power clamping circuits to provide a constant standby voltage even though an external voltage VCCE is varied.

That is, without driving a separate standby driver or using a standby reference voltage generator, the semiconductor memory device may clamp a voltage as a constant standby reference voltage even though the external voltage VCCE is varied. Furthermore, the semiconductor memory device may reduce only a preset threshold voltage difference from the clamped voltage and provide the first and second internal voltages VCCI and VCD_PB. According to an embodiment of the present invention, it is possible to implement a standby current which is significantly reduced in comparison with the conventional semiconductor memory device. Thus, the power efficiency of the semiconductor memory device may be improved.

Figure 4A:
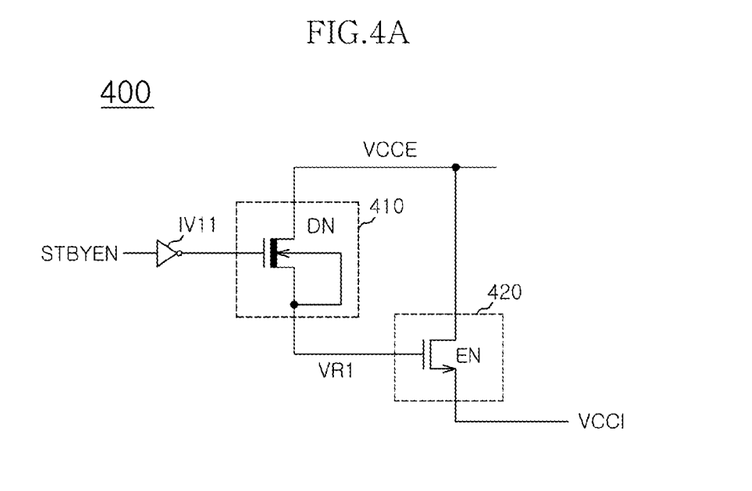
FIG. 4A is an equivalent circuit diagram of a first standby voltage providing unit of FIG. 3.
Figure 4B:
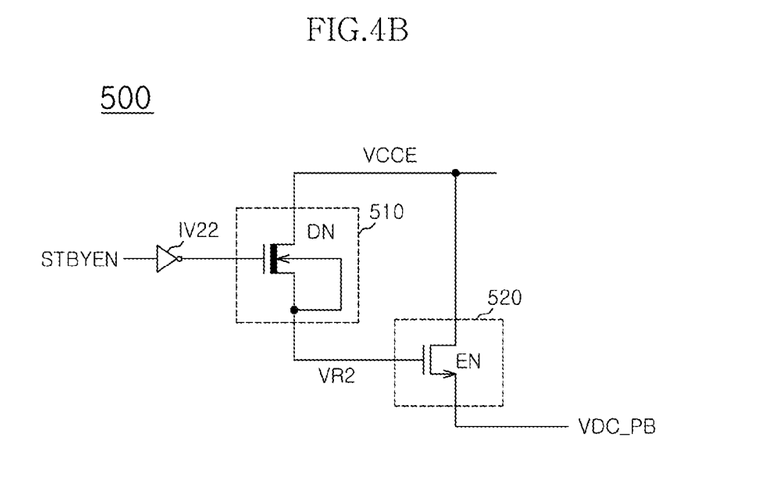
FIG. 4B is an equivalent circuit diagram of a second standby voltage providing unit of FIG. 3.

FIGS. 4A and 4B are simple circuit diagrams of the first and second standby voltage providing units 400 and 500 illustrated in FIG. 3.

Referring to FIGS. 4A and 4B, the first and second standby voltage providing units 400 and 500 will be described in more detail.

The first standby voltage providing unit 400 may include an inverter IV11, a first clamping section 410, and a second clamping section 420.

The first clamping section 410 may be a depletion-type NMOS transistor DN. When a gate voltage is 0V, a drain current may be passed, and the gate voltage decreases while increasing as a reverse bias.

The depletion-type NMOS transistor DN of the first clamping section 410 may have a threshold voltage of −2.6V, for example.

The depletion-type NMOS transistor DN may have a drain coupled to the external voltage VCCE, a source coupled to a gate of the second clamping section 420, and a drain configured to receive an inverted level of the standby enable signal STBYEN.

The operation of the first clamping section 410 will be described in more detail as follows. During the standby mode, when the standby enable signal STBYEN is activated, the gate of the depletion-type NMOS transistor DN may receive a voltage of 0V. Then, the depletion-type NMOS transistor DN may be electrically conducted. At this time, a voltage applied between the gate and source may correspond to |Vth|. Thus, when the external voltage VCCE is set in the range of 2.6V to 3.7V, only the absolute value of the threshold voltage of the depletion-type NMOS transistor DN, that is, 2.6V may be provided as a first standby reference voltage VR1 regardless of level variations of the external voltage VCCE.

In other words, as the depletion-type NMOS transistor DN is used as a clamping circuit, it may be possible to provide a constant voltage regardless of variations in the external voltage VCCE.

Since the second clamping section 420 may be a normal NMOS transistor, that is, an enhancement-type NMOS transistor, a value obtained by subtracting a threshold voltage difference according to the condition of the gate may become a voltage applied between the gate and source.

The second clamping section 420 may receive a constant gate voltage VR1 from the first clamping section 410, subtract only a preset threshold voltage (for example, 0.5V) from the received gate voltage VR1, and provide the resultant voltage as the first internal voltage VCCI. Under the condition in which a constant gate voltage is applied, the second clamping section 420 may clamp and provide a constant voltage.

In other words, during the standby mode, a predetermined voltage may be double-clamped to provide an internal voltage which is reduced by a predetermined level in comparison to the active mode. That is, the depletion-type NMOS transistor DN and the enhancement-type NMOS transistor EN may be cascade-coupled.

As a result, the first internal voltage VCCI during the standby mode may be set to 2.1V according to the following Equation 1.

First internal voltage=|VthDN|−|VhtEN| [Equation 1]

Here, |VthDN| may represent a threshold voltage of the depletion-type NMOS transistor, and |VhtEN| may represent a threshold voltage of the enhancement-type NMOS transistor.

Since the configuration of FIG. 4B is similar to that of FIG. 4A, the configuration of FIG. 4B will be described briefly.

The second standby voltage providing unit 500 may include an inverter IV22, a third clamping section 510, and a fourth clamping section 520.

The inverter IV22 may be configured to receive and invert the standby enable signal STBYEN.

The third clamping section 510 may include a depletion-type NMOS transistor DN, and may be configured to provide a constant voltage, that is a second standby voltage VR2 even though the external voltage VCCE is changed, during the standby mode.

The fourth clamping section 520 may include an enhancement-type NMOS transistor EN, and may have a gate coupled to a drain of the depletion-type NMOS transistor DN, a source coupled to the external voltage VCCE, and a drain serving as an output node to provide the second internal voltage VDC_PB.

Since the operation of FIG. 4B is similar to the operation of FIG. 4A, the duplicated descriptions are omitted herein. The second standby voltage providing unit 500 may double-clamp a voltage and provide the clamped voltage as the constant second internal voltage VDC_PB, regardless of variations of the external voltage VCCE.

During the standby mode, the first and second internal voltages VCCI and VDC_PB may have a slight error due to leakage characteristics of the transistor.

During the standby mode, however, since the first and second internal voltages VCCI and VDC_PB may be set to such a level as to retain data, a difference in voltage level during the standby mode does not cause a serious problem.

Figure 5:
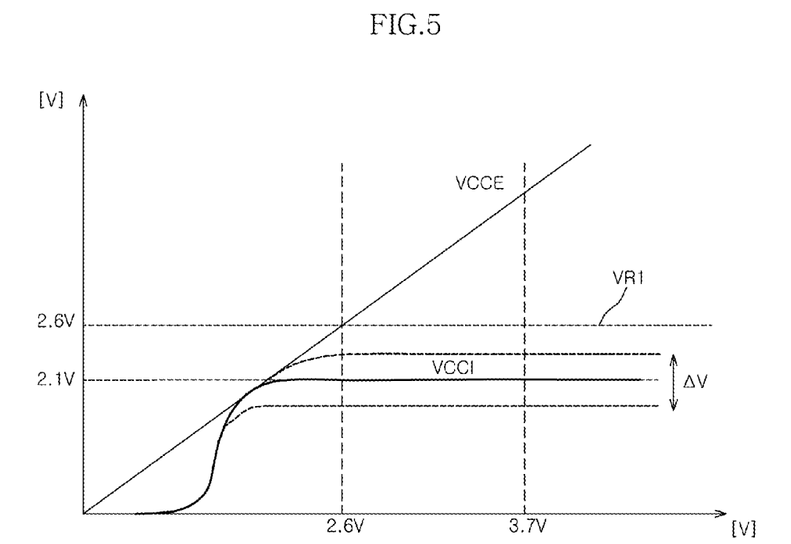
FIG. 5 is a graph illustrating changes of a standby reference voltage and a first internal voltage in accordance with changes of an external voltage VCCE.

FIG. 5 is a graph illustrating changes of the standby reference voltage and the first internal voltage VCCI in accordance with changes of the external voltage VCCE.

In the operating range of the external voltage VCCE from 2.6V to 3.7V, the first standby reference voltage VR1 is set to a constant voltage of 2.6V.

Referring to FIG. 5, it can be seen that the first internal voltage VCCI has a constant voltage range of about 2.1V. As described above, the first internal voltage VCCI may have a slight error ΔV.

Figure 6:
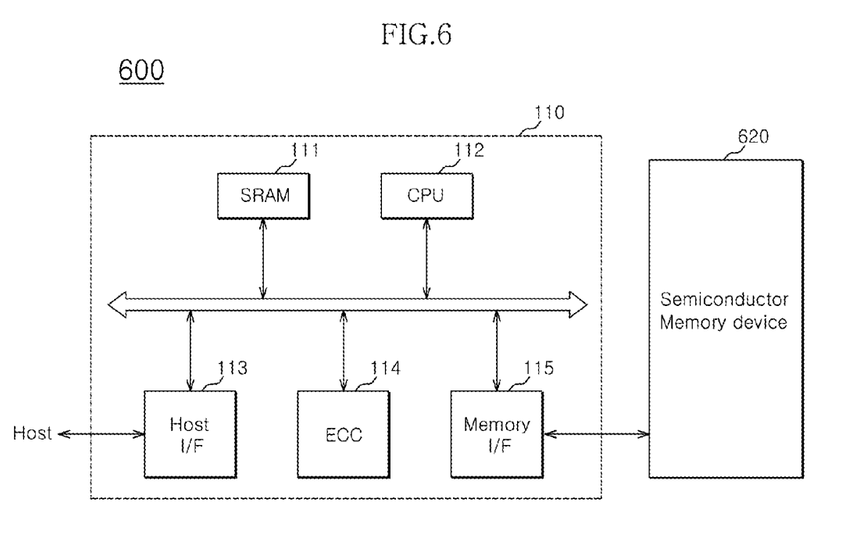
FIG. 6 is a block diagram illustrating a memory system according to an embodiment of the present invention.

FIG. 6 is a block diagram illustrating a memory system according to an embodiment of the present invention.

In FIG. 6, the memory system 600 of an embodiment of the present invention may include a semiconductor memory device 620, a memory controller 610, and a central processing unit (CPU) 612.

The semiconductor memory device 620 may service as a volatile memory device such as a dynamic random-access memory (DRAM). The memory controller 610 may control the semiconductor memory device 620, and may include a static random-access memory (SRAM) 611, a host interface 613, an error-correction code (ECC) 614, and a memory interface 615. The SRAM 611 may be used as an operation memory of the CPU 612. The CPU 612 may perform control operation for data exchange of the memory controller 610, and the host interface 613 may have data exchange protocol of a host accessed to the memory system 600. The ECC 614 may detect and correct error of data read from the semiconductor memory device 620, and the memory interface 615 may interface with the semiconductor memory device 620. The memory controller 610 may include further read-only memory (ROM) for storing data for interfacing with the host, etc.

Figure 7:
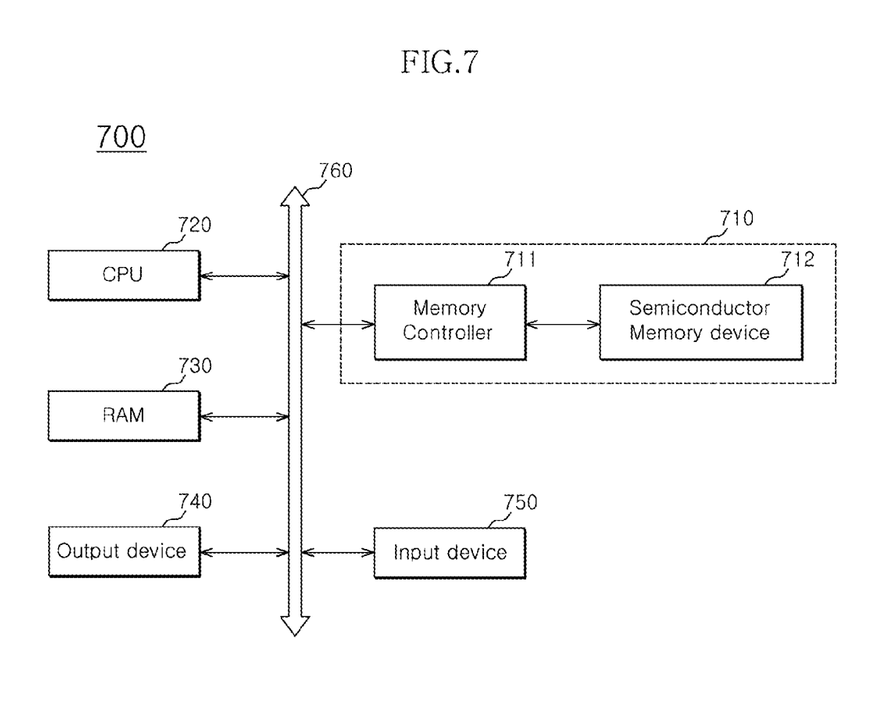
FIG. 7 is a view illustrating an electronic device or a computing system according to an embodiment of the present invention.

FIG. 7 is a view illustrating an electronic device or a computing system according to an embodiment of the present invention.

In FIG. 7, the computing system 700 of various embodiments of the present invention may include a CPU 720 connected electrically to a system bus 760, a RAM 730, an output device 740, an input device 750, and a memory system 710 including a memory controller 711 and a semiconductor memory device 712. In case that the computing system 700 is a mobile device, a battery (not shown) for supplying an operating voltage to the computing system 700 may be further provided. The computing system 700 of the present invention may further include an application chipset, a complementary-symmetry metal-oxide-semiconductor (CMOS) image processor CIS, a mobile DRAM, etc.

The output device 740 may be a self-contained display in the case of a portable electronic device. The input device 750 may be a physical keyboard or a virtual keyboard in the case of a portable electronic device such as i.e. a smartphone, tablet pc, labtop, etc. The portable electronic device may further include, without limitation, a trackball, touchpad, or other cursor control device combined with a selection control, such as a pushbutton, to select an item highlighted by cursor manipulation. The memory system 710 may include a semiconductor memory device 712 and memory controller 711 as described in conjunction with FIG. 6.

According to various embodiments of the present invention, the principle to generate a potential difference between the gate and source of the depletion-type transistor without a separate standby reference voltage generator or driver may be used to primarily clamp a voltage; and a difference between the primarily-clamped voltage and the preset threshold voltage may be used to secondarily clamp the primarily-clamped voltage, which makes it possible to provide an internal voltage having a stable and constant level.

Therefore, it is possible to implement a semiconductor memory device which is capable of reducing a standby current and improving power efficiency.

In an embodiment, a fuse signal and other signals may be applied.

While certain embodiments have been described above, it will be understood to those skilled in the art that various embodiments described are by way of example only. Accordingly, the semiconductor memory device described herein should not be limited based on the described embodiments. Rather, the semiconductor memory device described herein should only be limited in light of the claims that follow when taken in conjunction with the above description and accompanying drawings.

What is claimed is:

1. A semiconductor memory device comprising:
   a standby voltage providing unit configured to receive an external voltage, primarily clamp a predetermined voltage, secondarily clamp the primarily clamped voltage, and provide the secondarily clamped voltage as an internal voltage, during a standby mode.

2. The semiconductor memory device according to claim 1, wherein the standby voltage providing unit comprises:
   an inverter configured to receive and invert a standby enable signal;
   a first clamping section comprising a depletion-type NMOS transistor coupled to the inverter; and
   a second clamping section comprising an enhancement-type NMOS transistor coupled to the depletion-type NMOS transistor.

3. The semiconductor memory device according to claim 2, wherein the depletion-type NMOS transistor comprises:
   a gate coupled to the inverter;
   a drain electrically coupled to the external voltage; and
   a source coupled to the enhancement-type NMOS transistor.

4. The semiconductor memory device according to claim 3, wherein the depletion-type NMOS transistor has a negative threshold voltage level.

5. The semiconductor memory device according to claim 4, wherein the depletion-type NMOS transistor constantly clamps a potential difference between the gate and source to an absolute value of the threshold voltage even though the external voltage is varied, during the standby mode.

6. The semiconductor memory device according to claim 2, wherein the enhancement-type NMOS transistor comprises:
   a gate coupled to the depletion-type NMOS transistor;
   a drain electrically coupled to the external voltage; and
   a source coupled to the internal voltage node.

7. The semiconductor memory device according to claim 6, wherein the enhancement-type NMOS transistor has a positive threshold voltage level.

8. The semiconductor memory device according to claim 7, wherein the enhancement-type NMOS transistor receives a constant voltage from the depletion-type NMOS transistor through the gate thereof and clamps a potential difference between the gate and source to a constant level using a preset threshold voltage even though the external voltage is varied, during the standby mode.

9. A semiconductor memory device comprising:
   an active driver configured to receive a reference voltage and provide a first internal voltage at a first level during an active mode; and
   a standby voltage providing unit configured to provide the first internal voltage at a second level lower than the first level during a standby mode,
   wherein the standby voltage providing unit comprises cascade-coupled transistors having different types of channels.

10. The semiconductor memory device according to claim 9, wherein during the standby mode, the active driver is disabled.

11. The semiconductor memory device according to claim 9, wherein the standby voltage providing unit comprises:
   an inverter configured to receive and invert a standby enable signal;
   a first clamping section comprising a depletion-type NMOS transistor coupled to the inverter; and
   a second clamping section comprising an enhancement-type NMOS transistor cascade-coupled to the depletion-type NMOS transistor.

12. The semiconductor memory device according to claim 11, wherein the depletion-type NMOS transistor comprises:
   a gate coupled to the inverter;
   a drain electrically coupled to the external voltage; and
   a source coupled to the enhancement-type NMOS transistor.

13. The semiconductor memory device according to claim 12, wherein the depletion-type NMOS transistor has a negative threshold voltage level.

14. The semiconductor memory device according to claim 13, wherein the depletion-type NMOS transistor constantly clamps a potential difference between the gate and source to an absolute value of the threshold voltage even though the external voltage is varied, during the standby mode.

15. The semiconductor memory device according to claim 11, wherein the enhancement-type NMOS transistor comprises:
   a gate coupled to the depletion-type NMOS transistor;
   a drain electrically coupled to the external voltage; and
   a source coupled to the internal voltage node.

16. The semiconductor memory device according to claim 15, wherein the enhancement-type NMOS transistor has a positive threshold voltage level.

17. The semiconductor memory device according to claim 16, wherein the enhancement-type NMOS transistor receives a constant voltage from the depletion-type NMOS transistor through the gate thereof and clamps a potential difference between the gate and source to a constant level using a preset threshold voltage even though the external voltage is varied, during the standby mode.

18. A semiconductor memory device comprising:
   a standby voltage providing unit configured to double-clamp a predetermined voltage to provide an internal voltage having a reduced level during a standby mode in comparison to an active mode,
   wherein the standby voltage providing unit includes a depletion-type NMOS transistor and an enhancement-type NMOS transistor to clamp the predetermined voltage using threshold voltages.

19. The semiconductor memory device according to claim 18, wherein the standby voltage providing unit provides a voltage obtained by subtracting an absolute value of the threshold voltage of the enhancement-type NMOS transistor from an absolute value of the threshold voltage of the depletion-type NMOS transistor as the internal voltage.

20. The semiconductor memory device according to claim 19, wherein whether or not to turn on the depletion-type NMOS transistor of the standby voltage providing unit is controlled in response to a standby enable signal, and the enhancement-type NMOS transistor is cascade-coupled to the depletion-type NMOS transistor.

* * * * *